United States Patent
Sotta

(10) Patent No.: US 11,735,685 B2
(45) Date of Patent: Aug. 22, 2023

(54) SUPPORTS FOR A SEMICONDUCTOR STRUCTURE AND ASSOCIATED WAFERS FOR AN OPTOELECTRONIC DEVICE

(71) Applicant: Soitec, Bernin (FR)

(72) Inventor: David Sotta, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/385,138

(22) Filed: Jul. 26, 2021

(65) Prior Publication Data
US 2021/0351318 A1 Nov. 11, 2021

Related U.S. Application Data

(63) Continuation of application No. 16/487,037, filed as application No. PCT/FR2018/050446 on Feb. 26, 2018, now Pat. No. 11,245,050.

(30) Foreign Application Priority Data

Mar. 1, 2017 (FR) ...................... 1751666

(51) Int. Cl.
*H01L 21/02* (2006.01)
*H01L 33/00* (2010.01)
(Continued)

(52) U.S. Cl.
CPC ...... *H01L 33/007* (2013.01); *H01L 21/02002* (2013.01); *H01L 21/0254* (2013.01);
(Continued)

(58) Field of Classification Search
CPC ............ H01L 33/007; H01L 21/02389; H01L 21/0254; H01L 21/3245; H01L 33/0075; H01L 33/12; H01L 21/02002
See application file for complete search history.

(56) References Cited

U.S. PATENT DOCUMENTS

2010/0032793 A1* 2/2010 Guenard ............. H01L 31/1848
438/480
2010/0072489 A1 3/2010 McLaurin et al.
(Continued)

FOREIGN PATENT DOCUMENTS

CN 1726581 A 1/2006
EP 2151852 A1 2/2010
WO WO-2011090581 A1 * 7/2011 ............. H01L 33/02

OTHER PUBLICATIONS

International Search Report for International Application No. PCT/FR2018/050446, dated Jun. 5, 2018, 2 pages.
(Continued)

*Primary Examiner* — Selim U Ahmed
*Assistant Examiner* — Evan G Clinton
(74) *Attorney, Agent, or Firm* — TraskBritt

(57) ABSTRACT

A method for preparing a crystalline semiconductor layer in order for the layer to be provided with a specific lattice parameter involves a relaxation procedure that is applied for a first time to a first start donor substrate in order to obtain a second donor substrate. Using the second donor substrate as the start donor substrate, the relaxation procedure is repeated for a number of times that is sufficient for the lattice parameter of the relaxed layer to be provided with the specific lattice parameter. A set of substrates may be obtained by the method.

19 Claims, 2 Drawing Sheets

(51) Int. Cl.
 H01L 21/324 (2006.01)
 H01L 33/12 (2010.01)
(52) U.S. Cl.
 CPC .... *H01L 21/02389* (2013.01); *H01L 21/3245* (2013.01); *H01L 33/0075* (2013.01); *H01L 33/12* (2013.01)

(56) References Cited

U.S. PATENT DOCUMENTS

| | | |
|---|---|---|
| 2012/0241918 A1 | 9/2012 | Boulet |
| 2015/0270120 A1 | 9/2015 | Wang et al. |
| 2018/0087049 A1 | 3/2018 | Mak et al. |

OTHER PUBLICATIONS

International Written Opinion for International Application No. PCT/FR2018/050446, dated Jun. 5, 2018, 5 pages.
Yin et al., Buckling Suppression of SiGe Islands on Compliant Substrates, 2003, Journal of Applied Physics, vol. 94, No. 10, pp. 6875-6882.
Taiwan Office Action and Search Report for Taiwan Application No. 107106674 dated Aug. 4, 2021 with machine translation, 10 pages.
Chinese First Notification of Office Action for Application No. 201880014740.7 dated Sep. 28, 2022, 7 pages.

\* cited by examiner

SUPPORTS FOR A SEMICONDUCTOR STRUCTURE AND ASSOCIATED WAFERS FOR AN OPTOELECTRONIC DEVICE

CROSS-REFERENCE TO RELATED APPLICATIONS

This application is a continuation of U.S. patent application Ser. No. 16/487,037, filed Aug. 19, 2019, now U.S. patent application Ser. No. 11/245,050, issued Feb. 8, 2022, which is a national phase entry under 35 U.S.C. § 371 of International Patent Application PCT/FR2018/050446, filed Feb. 26, 2018, designating the United States of America and published as International Patent Publication WO 2018/158529 A1 on Sep. 7, 2018, which claims the benefit under Article 8 of the Patent Cooperation Treaty to French Patent Application Serial No. 1751666, filed Mar. 1, 2017, the disclosure of each of which is hereby incorporated herein in its entirety by this reference.

TECHNICAL FIELD

The present disclosure relates to a growth substrate for forming optoelectronic devices and to a process for fabricating this substrate.

BACKGROUND

Document US20100072489 discloses semiconductor structures made of III-N material each comprising, on a growth substrate, electroluminescent layers placed between an n-type region and a p-type region. These semiconductor structures may be light-emitting diodes (LEDs). The growth substrate comprises a plurality of InGaN islands joined to a host by a bonding layer. The growth substrate is formed in such a way that each InGaN island is at least partially relaxed. This document proposes to form the electroluminescent layers emitting blue light from InGaN comprising a proportion of indium comprised between 0.16 and 0.18; to form the electroluminescent layers emitting cyan light from InGaN comprising a proportion of indium comprised between 0.19 and 0.22; and to form the electroluminescent layers emitting green light from InGaN comprising a proportion of indium comprised between 0.23 and 0.25. Electroluminescent layers emitting red light could require a proportion of indium of about 0.35.

It is known that the proportion of indium that it is possible to incorporate into an InGaN layer during its epitaxial growth is limited by its strain state. When the state is a highly strained state, the indium atoms are excluded from the InGaN lattice in order to form an alloy of different composition and decrease the strain energy of the system. Ideally, to avoid this phase-separation effect, it would therefore be desirable to provide a growth substrate comprising InGaN islands having a lattice parameter suitable for receiving relaxed electroluminescent layers. This lattice parameter must be matched to the defined proportion of InGaN so that the electroluminescent layer emits the chosen color of light. Thus, to form effective LEDs, it would be desirable to provide a growth substrate comprising InGaN islands having a lattice parameter of about 3.22 Å to form electroluminescent layers emitting a color in the blue, or having a lattice parameter of about 3.27 Å to form electroluminescent layers emitting a color in the green, or even having a lattice parameter of about 3.31 Å to form electroluminescent layers emitting a color in the red.

The aforementioned document and documents US2010087049 and EP2151852 propose processes allowing relaxed or partially relaxed InGaN islands to be formed. According to the approach presented in these documents, a strained InGaN layer intended to form the islands of the growth substrate is firstly formed on a donor substrate comprising a GaN surface layer. Since this InGaN layer is strained, it is generally not possible to exceed a proportion of indium of about 8 to 10% without decreasing the quality of this layer.

This strained InGaN layer is transferred to a relaxation carrier comprising a surface flow layer by bonding and by thinning and/or fracture of the donor substrate. Next, the strained islands are defined in the transferred InGaN layer. The relaxation carrier and the islands are heat-treated at a temperature above the glass transition temperature of the flow layer, this leading to at least partial relaxation of the islands. To assist this relaxation and to avoid potential buckling of the islands during the plastic deformation, provision is made to form a stiffening layer on the islands, before the application of the relaxation heat treatment. As is detailed in the document "Buckling suppression of SiGe islands on compliant substrates," Yin et al (2003), *Journal of Applied Physics*, 94(10), 6875-6882, the degree of relaxation of an island obtained after this heat treatment step is the degree that results in equilibrium between the stresses present in the stiffening layer and in the island. The relaxation of the InGaN layer is therefore generally not complete, unless islands of very small sizes that are less sensitive to the effect of buckling, are formed. The relaxation of an InGaN island having a dimension of about one mm, using the techniques of the prior art, allows a degree of relaxation comprised between 60% and 80% to be achieved.

The combination of a limited proportion of indium in an InGaN island and of a partial relaxation of this island leads the lattice parameter of the islands that it is possible to obtain on a growth substrate to be limited, unless the dimension of these islands is very greatly limited. Therefore, it is not always possible to form electroluminescent layers emitting directly at a wavelength requiring a relatively large lattice parameter, such as in the domain of the green or of the red.

The present disclosure aims to overcome all or some of the aforementioned drawbacks.

It, in particular, aims to provide a substrate having a growth layer having a lattice parameter that may be freely chosen.

BRIEF SUMMARY

With a view to achieving one of these aims, the subject of the present disclosure is a process for preparing a crystalline semiconductor layer so that it has a defined lattice parameter, the process implementing a relaxation sequence comprising:
  forming a strained layer on a start donor substrate;
  transferring at least one portion of the strained layer to a relaxation carrier comprising a flow layer;
  applying a heat treatment sufficient to relax at least partially the strained layer and provide a relaxed layer on the relaxation carrier;
  attaching the relaxed layer to a base carrier in order to form a second donor substrate.

According to the present disclosure, the relaxation sequence is applied a first time to a first start donor substrate then repeated, taking the second donor substrate as start donor substrate, a sufficient number of times so that the lattice parameter of the relaxed layer has the defined lattice parameter.

According to other advantageous and non-limiting features of the present disclosure, which may be implemented alone or in any technically feasible combination:

- the first start donor substrate comprises a GaN surface layer;
- the strained layer is an InGaN layer having a sufficient proportion of indium to be compressively strained during its formation on the start donor substrate;
- the transferring step of the relaxation sequence comprises bonding the strained layer to the relaxation carrier comprising a flow layer and removing the start donor substrate by laser detachment and/or fracture and/or thinning;
- the start donor substrate is removed after the heat treatment step;
- the relaxation sequence comprises processing the strained layer in order to form islands before the relaxation heat treatment step;
- the relaxation sequence comprises a step of forming a relaxed continuous layer by coalescent deposition on the islands after the attachment of the islands to the base carrier;
- the attaching step of the relaxation sequence comprises bonding the relaxed layer to the base carrier and removing the relaxation carrier and the flow layer by laser detachment and/or fracture and/or thinning;
- the defined lattice parameter is comprised between 3.22 Å and 3.31 Å.

BRIEF DESCRIPTION OF THE DRAWINGS

Other features and advantages of the present disclosure will become apparent from the following detailed description of the present disclosure that is given with reference to the appended figures, in which.

DETAILED DESCRIPTION

For the sake of keeping the following description simple, the same references are used for identical elements or for elements performing the same function.

A process according to the present disclosure aims to prepare a crystalline semiconductor layer having a defined or target lattice parameter. This target lattice parameter may depend on the sought-after final application. By way of example and with no limitation to the domain of application of the process that is the subject of the present disclosure, a process aiming to prepare a crystalline InGaN layer able to receive the electroluminescent layers of nitride-based LEDs emitting in the domain of the blue, of the green or of the red is presented. Whatever the state or the degree of strain of this layer, it is aimed for it to have a target lattice parameter, to within plus or −0.5%, equal to 3.22 Å, 3.27 Å or 3.31 Å.

Figure 1:
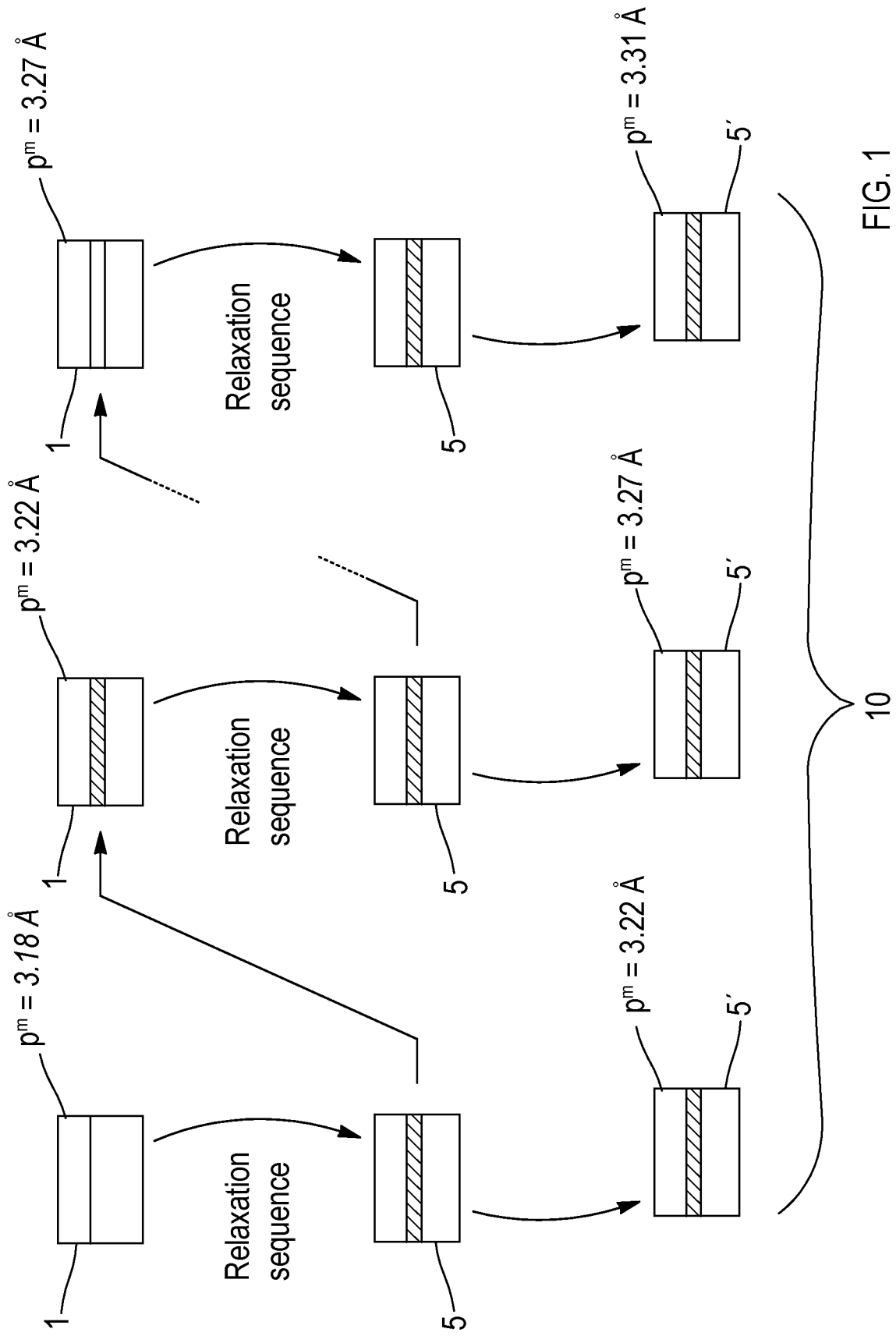
FIG. 1 shows an overview of a process according to the present disclosure.

As is schematically shown in FIG. 1, a process according to the present disclosure successively applies at least two relaxation sequences to a layer issued from a first start donor substrate 1. This layer has a first lattice parameter relatively far from the target lattice parameter, of about 3.185 Å when the start donor substrate consists of a GaN layer placed on a sapphire carrier. At the end of the application of the first relaxation sequence, a second donor substrate 5, comprising an InGaN layer having a second lattice parameter, different from the first and closer to the target lattice parameter, is obtained. This second donor substrate 5 may be employed as new start donor substrate 1, wherein a second relaxation sequence may be applied. At the end of this second application, a new second donor substrate 5 comprising an InGaN layer the lattice parameter that is yet closer to the target lattice parameter is obtained. This cycle may be repeated as many times as necessary to obtain a donor substrate comprising a crystalline semiconductor layer having the target lattice parameter, for example, equal or close to one of those that were listed in the preceding paragraph.

Advantageously, the process according to the present disclosure is simultaneously applied to a plurality of start donor substrates. At the end of each iteration of the relaxation sequence, or at the end of certain parts of these iterations, at least one second donor substrate among the obtained plurality of second donor substrates may be sampled if the latter comprises a layer the lattice parameter that is sufficiently close, to within 0.5%, to one of the target lattice parameters. The other non-sampled second donor substrates will possibly receive a new iteration of the relaxation sequence.

Thus, and as will be described in detail in the rest of this description, at the end of the first iteration, it is possible to sample a second donor substrate 5 comprising an InGaN layer having a lattice parameter of about 3.22 Å (to within 0.5%); to sample a second donor substrate 5 at the end of the second iteration, this second donor substrate comprising an InGaN layer the lattice parameter that is about 3.27 Å (to within 0.5%); and to sample a second donor substrate 5 at the end of the third iteration of the relaxation sequence, this second donor substrate 5 comprising an InGaN layer the lattice parameter that is about 3.31 Å (to within 0.5%).

It is therefore possible to obtain, at the end of the process of the present disclosure, a plurality of second donor substrates 5 each comprising an InGaN layer the lattice parameter that corresponds to one of the target lattice parameters. Therefore, these donor substrates may each serve as host for the formation of an electroluminescent layer emitting directly at a chosen wavelength.

Since the process of the present disclosure may be relatively complex to implement, in particular, when the number of iterations of the relaxation sequence is high, it is preferable not to employ the second donor substrates 5 directly as growth substrate for electroluminescent layers, but to keep them as mother substrates 5'. It is possible to sample layers of these mother substrates 5' with a view to attaching them to secondary carriers, and the secondary substrates thus formed may themselves be used as growth substrate to form the electroluminescent semiconductor structures. After each sample, or after a defined number of samples, a thickness of the sampled layer of the mother substrates 5' may be reformed in order to regenerate it.

On a production line for producing growth substrates for electroluminescent structures, a collection 10 of mother substrates 5' each having different characteristics will possibly be kept. Depending on the nature of the electroluminescent semiconductor structure that must be fabricated on a growth substrate, the mother substrate 5' comprising a layer the lattice parameter that is the most suitable for the fabrication of this structure will be selected. By way of example, on a production line for producing growth substrates for LEDs, the process according to the present disclosure may lead to a collection 10 of mother substrates 5' being formed, each substrate of the collection comprising a layer the lattice parameter that is suitable for receiving an LED emitting one defined color directly. The collection 10 of mother substrates 5' may thus comprise:

a first mother substrate 5' comprising an InGaN layer, the lattice parameter of which is 3.22 Å (to within 0.5%);

a second mother substrate 5' comprising an InGaN layer, the lattice parameter of which is 3.27 Å (to within 0.5%);

a third mother substrate 5' comprising an InGaN layer, the lattice parameter of that is 3.31 Å (to within 0.5%).

Figure 2A:
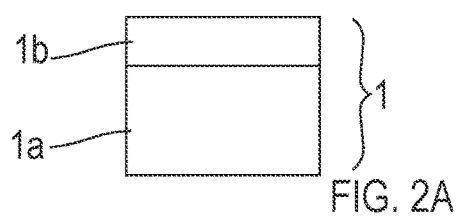
FIGS. 2A-2H show an example of application of a relaxation sequence to a start donor substrate.

The steps of a process according to the present disclosure and aiming to prepare a crystalline InGaN layer suitable for receiving electroluminescent layers of nitride-based LEDs will now be described in more detail. FIGS. 2A to 2H thus show an example of application of a relaxation sequence to a first start donor substrate 1, and FIG. 2A shows this first start donor substrate 1. It comprises a first base carrier 1a, on which a semiconductor buffer layer 1b has been placed. The first base carrier 1a may correspond to a circular wafer, for example, made of silicon, of silicon carbide or of sapphire, of standardized dimensions of, for example, 2 inches (50 mm), 4 inches (100 mm), or even of 200 mm diameter or more. However, the present disclosure is in no way limited to these dimensions or to this shape. The buffer layer 1b may be a GaN buffer layer formed by deposition on the first base carrier 1a. It has a sufficient thickness, for example, larger than 1 micron, to be sufficiently relaxed and to have a lattice parameter substantially equal to 3.185 Å.

In one alternative (not shown), the first start donor substrate 1 may consist of a bulk substrate, for example, a GaN or SiC bulk substrate. Whatever the nature or shape of the first start donor substrate 1, the latter has an exposed surface made of a crystalline semiconductor, the lattice parameter of which (which lattice parameter is called the "start lattice parameter" in the rest of this description) does not correspond to the target lattice parameters.

Figure 2B:
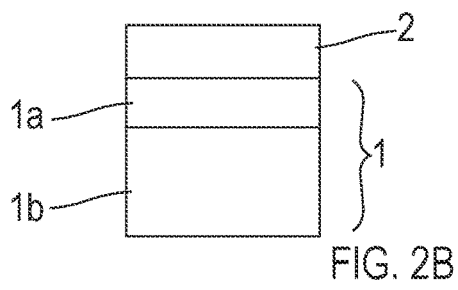

In a following step of the relaxation sequence, shown in FIG. 2B, a strained layer 2 is formed on the first start donor substrate 1. Generally, the nature of the layer 2, and therefore its compressive or tensile strain, is chosen depending on the relative value of the start lattice parameters and of the target lattice parameter. If the start lattice parameter is lower than the target lattice parameters, a compressively strained layer 2 will be formed. The relaxation of this layer will lead its lattice parameter to increase and therefore it to get closer to the target lattice parameter. If, in contrast, the start lattice parameter is larger than the target lattice parameter, a tensilely strained layer 2 will be formed. The relaxation of this layer will lead its lattice parameter to decrease and therefore it to also get closer to the target lattice parameter.

Also generally, the strained layer 2 will have a thickness smaller than its critical plastic-relaxation thickness, in order to preserve its strained state and its crystal quality.

In the example shown in FIG. 2, a compressively strained InGaN layer 2 is formed on the GaN buffer layer 1b. It will therefore be sought to form a strained layer 2 having a maximum indium concentration, without however exceeding the concentration limit above which phase segregation appears, as this could decrease the crystal quality of this layer 2. Thus, in the example shown in FIGS. 2A-2H, the strained layer will possibly be formed of an InGaN layer having an indium concentration comprised between a few % and 10%, and preferably equal to 8%, and a thickness of 200 nanometers.

Figure 2C:
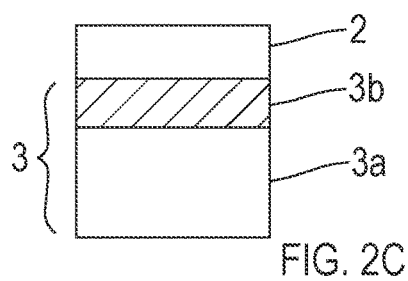

The following step of the relaxation sequence consists in transferring at least one portion of the strained layer 2 to a relaxation carrier 3 comprising a flow layer 3b on a base substrate 3a, the flow layer 3b located at the surface of the relaxation carrier 3. At the end of this transferring step, as is shown in FIG. 2C, at least one portion of the strained layer 2 is placed in contact with the flow layer 3b of the relaxation carrier 3. The flow layer may consist of or comprise BPSG.

Many layer-transferring methods may allow this transfer to be achieved, in particular, the methods described in the cited prior-art documents. By way of example, and to ensure the completeness of the present description, the transferring method may comprise the succession of following steps:

applying a first flow layer to the exposed face of the strained layer;

implanting light species (hydrogen and/or helium) through this first flow layer in order to form a fragile plane in the strained layer 2 or, preferably, in the buffer layer 1b;

bringing the first flow layer into contact with a second flow layer formed on the surface of the relaxation carrier 3, so as to join the first base substrate 1 and the relaxation carrier 3 to each other. The strained layer 2 and the flow layer 3b are located between these two elements, the flow layer 3b consisting of the first and second flow layers joined together;

supplying thermal and/or mechanical energy in order to fracture the assembly in the fragile plane formed by the implanted species.

In the case where this fragile plane was formed in the buffer layer 1b, the transferring process leads one portion of this layer to be attached to the relaxation carrier 3. This portion of the buffer layer 1b may be selectively removed for example, by dry or wet etching in order to achieve the structure shown in FIG. 2C.

This transferring method is advantageous in that it allows most of the start donor substrate 1 to be preserved, and the latter may therefore be reused. However, other transferring methods are possible; for example, the base substrate 1 and the relaxation substrate may be joined and laser irradiation through the first base carrier 1a used to detach the latter from the buffer layer 1b, or indeed grinding and physical removal of this base substrate 1a and/or the buffer layer 1b may be employed. The present disclosure is therefore in no way limited to any one way of transferring the strained layer 2 to the relaxation carrier 3.

It will be noted that the removal of the base substrate 1 and/or the buffer layer 1b is not necessarily carried out before the relaxation heat treatment is applied in the following step. Provision may be made to apply this heat treatment after the joining step and before the removing step.

The following step of the relaxation sequence comprises applying a heat treatment to the structure of FIG. 2C comprising the relaxation substrate and the strained layer 2, in order to at least partially relax this layer 2 and to provide an at least partially relaxed layer 2'. For the sake of simplicity, this at least partially relaxed layer will be called the "relaxed layer 2" in the rest of the description. This so-called relaxation heat treatment exposes the flow layer 3b to a temperature above its glass transition temperature. The viscosity of the flow layer is then sufficient to allow the strained layer 2 to at least partially relax plastically by lateral extension. The relaxation heat treatment may, by way of example, comprise exposing the structure to a temperature of 300° C. to 1000° C. for a few minutes to a few hours in a neutral atmosphere, depending on the nature of the flow layer. When the latter comprises BPSG, the heat treatment may comprise exposing the structure to 900° C. for 1 hour.

As was described above, this lateral extension may cause the strained layer 2 to buckle as it relaxes. In order to limit this, it is preferable to form, on the strained layer 2, before the application of the relaxation heat treatment, a stiffening layer 4. In addition, again with the aim of facilitating the relaxation during the relaxation heat treatment, it is also advantageous to define, in the strained layer 2, islands of material, by way of trenches extending at least through the layer 2 and, optionally, into the flow layer 3b.

Figure 2D:
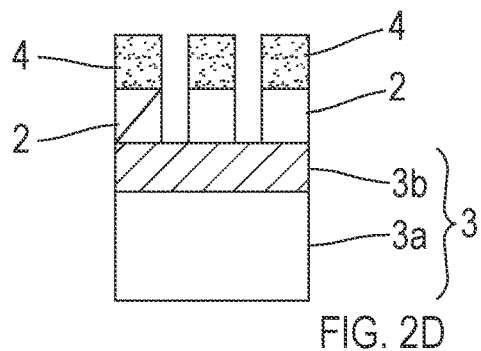
Figure 2E:
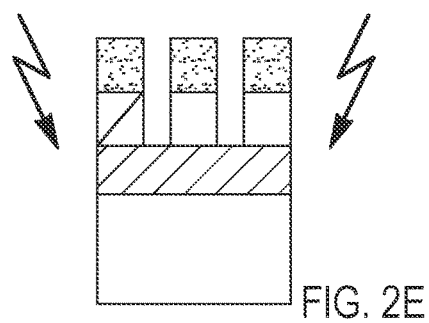
Figure 2F:
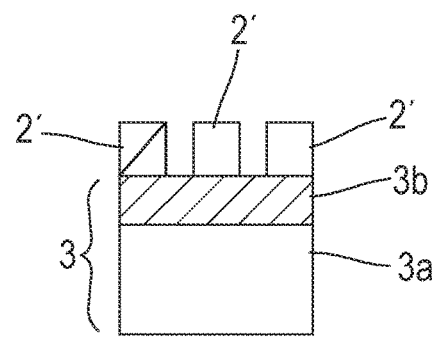
Figure 2G:
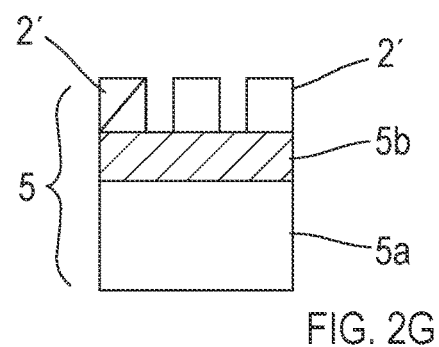

FIG. 2D thus shows the structure advantageously prepared before the application of the relaxation heat treatment. This relaxation heat treatment is shown symbolically in FIG. 2E. It may be repeated a plurality of times in order to relax more fully the layer 2 or the islands of the layer 2. Provision may be made, between two applications of a heat treatment, to thin or even completely remove the stiffening layer 4. Whatever the form of the relaxation heat treatment, at the end of its application the stiffening layer 4 may be removed. An at least partially relaxed InGaN layer 2' is then obtained, as shown in FIG. 2F. This layer may consist of a plurality of islands, if such islands were formed before the application of the relaxation heat treatment, as was explained above. In any case, the relaxed layer 2' is placed on the flow layer 3b of the relaxation carrier 3.

In a following step of the relaxation sequence, the relaxed InGaN layer 2' is attached to a base carrier 5a. This attachment may comprise joining the relaxed layer 2' to the base carrier 5a, a bonding layer 5b optionally being placed therebetween, and removing the relaxation carrier 3 along with its flow layer 3b. The relaxation carrier may be removed mechanically, by demounting by laser irradiation if the carrier is transparent, or by any other method. The flow layer 3b may be removed by chemical etching. At the end of this step, a relaxed InGaN layer 2' is obtained, which is optionally placed on a bonding layer 5b, which itself is placed on the base carrier 5a. This structure forms a second donor substrate 5. The relaxed layer 2' may consist of a set of islands. The relaxed InGaN layer 2' has a lattice parameter of about 3.22 Å. This lattice parameter may be sufficient for photoluminescent layers that emit in the domain of the blue to be formed thereon, but insufficient for photoluminescent layers that emit in the domain of the red and of the green to be formed thereon. It remains lower than the target lattice parameters that were defined above for these two emission colors. To correct this, and as may be seen in FIG. 1, the application of the relaxation sequence that has just been described is repeated taking the second donor substrate 5 as new start donor substrate.

Figure 2H:
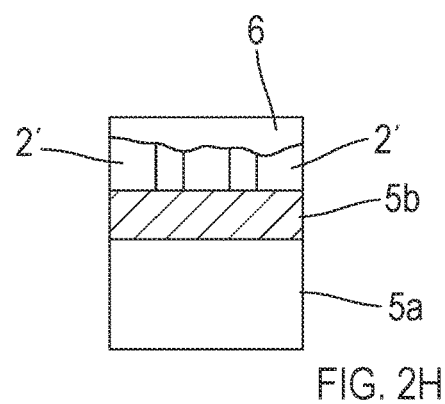

In the case where the relaxed layer 2' consists of islands, as is recommended and shown in FIGS. 2D to 2G, provision may be made, before the relaxation sequence is applied again, to grow, on these islands, a covering layer 6 composed of InGaN and, for example, having the same indium content as the islands. This covering layer aims to close the trenches separating the islands and therefore to form a continuous layer on the surface of the second donor substrate 5. This configuration is shown in FIG. 2H. It may be obtained by epitaxial lateral overgrowth.

When the relaxation sequence is applied again, taking the second donor substrate 5 as start substrate, the buffer layer 1b of the start substrate is then formed by the relaxed layer 2' and potentially the covering layer 6 if the latter is present. The first base carrier 1a consists of the base carrier 5a and the bonding layer 5b.

In the second iteration of the relaxation sequence, and in the following iterations, the step of forming the strained layer 2 comprises forming an InGaN layer having an indium concentration higher than that of the strained layer of the preceding iteration. Specifically, the lattice parameter of the buffer layer 1b in the new iteration is larger than the lattice parameter of the buffer layer of the preceding iteration. This therefore allows a higher proportion of indium to be incorporated into the strained layer 2 without phase separation. By way of example, the InGaN layer may have an indium concentration comprised between 10% and 20%, in the second iteration of the described example.

In the case where a covering layer 6 has not been formed on the second donor substrate 5 and where, therefore, the buffer layer 1b is made up of islands, provision may be made for the step of forming the new strained layer 2, in the new iteration of the relaxation sequence, to lead these islands to be covered and a continuous strained layer 2 to be formed.

By completely repeating the application of the relaxation sequence such as described above, at the end of the second cycle a second donor substrate 5 having a relaxed InGaN layer 2' and optionally a covering layer 6 having a lattice parameter of about 3.27 Å are obtained. This second substrate issued from the second iteration therefore has a relaxed layer made of InGaN the lattice parameter of which is suitable for the fabrication of an LED emitting in the domain of the green. It may therefore be exploited to this end or kept as a mother substrate 5', as was described above.

To obtain a layer having a lattice parameter suitable for the fabrication of a red LED, a new cycle or as many cycles as necessary may be carried out. In each new cycle, the proportion of InGaN during the formation of the strained layer 2 of the relaxation sequence may be increased. Furthermore, at the end of each new cycle, a second donor substrate 5 the lattice parameter of which has increased is obtained. More generally, at the end of each new cycle, an at least partially relaxed crystalline semiconductor layer the lattice parameter of which is closer to the target lattice parameter is obtained.

Of course, the present disclosure is not limited to the described embodiments and variants thereof may fall within the scope of the invention as defined by the claims.

In particular, although here the example of an InGaN crystalline semiconductor layer was given, the principles of the present disclosure are applicable to any other material the lattice parameter that it is desired to modify.

Lastly, although here the example of production of LEDs was given, the present disclosure may be applicable to the production of other types of devices in the field of optoelectronics or electronics.

What is claimed is:

1. A support for a semiconductor structure, comprising:
   a substrate comprising a base carrier and a bonding material overlying the base carrier;
   islands comprising semiconductor material overlying the bonding material; and
   an additional semiconductor material laterally separating the islands from one another, the semiconductor material and the additional semiconductor material comprising a relaxed continuous material having a defined lattice parameter within a range of from about 3.22 Å to about 3.31 Å.

2. The support of claim 1, wherein the relaxed continuous material of the semiconductor material exhibits the defined lattice parameter comprising one or more of about 3.22 Å, about 3.27 Å, and about 3.31 Å.

3. The support of claim 2, wherein a value of the defined lattice parameter is within about 0.5% of a target value of the defined lattice parameter.

4. The support of claim 1, wherein the base carrier comprises one or more of silicon, silicon carbide, and sapphire.

5. The support of claim 1, wherein the semiconductor material and the additional semiconductor material individually comprise a crystalline InGaN layer.

6. The support of claim 1, wherein the additional semiconductor material directly contacts side surfaces and upper surfaces of the islands to provide a coalesced material of the relaxed continuous material of the semiconductor material.

7. The support of claim 1, wherein the semiconductor material is configured to receive electroluminescent layers of nitride-based light-emitting diodes emitting in one or more of a blue domain, a green domain, and a red domain of the electromagnetic radiation spectrum.

8. A support for a semiconductor structure, comprising:
a base material;
a crystalline semiconductor material comprising a relaxed continuous material having a defined lattice parameter adjacent to the base material, the crystalline semiconductor material comprising:
islands adjacent to the base material; and
a covering material comprising an additional crystalline semiconductor material laterally separating individual islands from one another, the covering material comprising a material composition substantially the same as a material composition of the islands.

9. The support of claim 8, wherein the crystalline semiconductor material comprises InGaN having a concentration of indium within a range of from about 8% to about 20%.

10. The support of claim 9, wherein each of the islands and the covering material comprises InGaN, the covering material having substantially the same concentration of the indium as the islands.

11. The support of claim 8, wherein the crystalline semiconductor material is bonded to the base material with an adhesive.

12. The support of claim 8, wherein the relaxed continuous material of the crystalline semiconductor material comprises an at least partially relaxed strained material layer.

13. The support of claim 8, wherein the crystalline semiconductor material has a thickness sufficient to provide the defined lattice parameter within a range of from about 3.22 Å to about 3.31 Å.

14. A wafer for an optoelectronic device, comprising:
a support structure; and
a crystalline semiconductor material mounted on the support structure, the crystalline semiconductor material comprising a relaxed continuous material having a defined lattice parameter and comprising at least partially relaxed islands laterally separated from one another by an additional crystalline semiconductor material directly contacting side surfaces and upper surfaces of the at least partially relaxed islands.

15. The wafer of claim 14, further comprising a bonding material between the support structure and the crystalline semiconductor material, the additional crystalline semiconductor material directly contacting upper surfaces of the bonding material.

16. The wafer of claim 15, wherein the at least partially relaxed islands directly contact the additional crystalline semiconductor material and the bonding material.

17. The wafer of claim 14, wherein the defined lattice parameter of the relaxed continuous material is within about 0.5% of one or more of about 3.22 Å, about 3.27 Å, and about 3.31 Å.

18. The wafer of claim 14, wherein the crystalline semiconductor material comprises InGaN suitable for fabrication of one or more of a light-emitting device, an electronic device, and an optoelectronic device.

19. The wafer of claim 14, wherein the relaxed continuous material of the crystalline semiconductor material is configured to serve as a host for an electroluminescent layer that emits directly at a selected wavelength of the electromagnetic radiation spectrum.

* * * * *